United States Patent [19]

Gallo, Jr. et al.

[11] 3,801,728

[45] Apr. 2, 1974

[54] MICROELECTRONIC PACKAGES

[75] Inventors: Paul Joseph Gallo, Jr.; Anthony Joseph Schorr, both of Birdsboro, Pa.

[73] Assignee: Bell Telephone Laboratories, Incorporated, Murray Hill, N.J.

[22] Filed: Oct. 20, 1972

[21] Appl. No.: 299,603

[52] U.S. Cl. ............ 174/52 S, 29/630 R, 29/630 B, 174/DIG. 3, 174/DIG. 5, 317/100

[51] Int. Cl. .............. H05k 5/00

[58] Field of Search ............ 174/52 R, 52 S, 52 PE, 174/DIG. 3, DIG. 5; 29/627, 628, 630 R, 630 B, 630 D

[56] References Cited

UNITED STATES PATENTS

| | | | |
|---|---|---|---|
| 3,585,272 | 6/1971 | Shatz | 174/52 S |
| 3,646,409 | 2/1972 | Van de Water et al. | 174/52 PE |
| 3,689,683 | 9/1972 | Paletto et al. | 174/52 PE |
| 3,312,771 | 4/1972 | Hessinger et al. | 174/50.61 |
| 3,469,148 | 9/1969 | Lund | 29/627 |
| 3,444,309 | 5/1969 | Dunn | 29/627 |
| 3,381,372 | 5/1968 | Capano | 29/627 |

*Primary Examiner*—Charles W. Lanham
*Assistant Examiner*—James R. Duzan
*Attorney, Agent, or Firm*—C. E. Graves; E. B. Cave

[57] ABSTRACT

Apparatus and method of manufacturing microelectronic packages which have good heat dissipation characteristics are disclosed. A lead frame having a plurality of individual terminals is laminated to a metal base between layers of plastic insulation. A microelectronic circuit chip may now be bonded to an exposed region of the metal base without being subjected to the relatively high temperature involved in conventional package assembly operations. Following the bonding of the chip to the base, connections are made to the individual conductors and a cover is affixed which leaves an exposed surface on the base. The exposed surface acts as a heat sink and is effective to dissipate built-up heat.

4 Claims, 5 Drawing Figures

MICROELECTRONIC PACKAGES

This invention relates to packages for microelectronic circuits and, more particularly, to such packages as are effective for dissipating heat built up in the circuit through high power operation.

BACKGROUND OF THE INVENTION

In order to protect the delicate electrical connections in microelectronic circuits, the circuits are generally packaged in an encapsulating housing. Although such encapsulated packages are effective for protection, they also serve to confine any built-up heat created by the operation of the circuit. Since such circuits are generally quite temperature sensitive, the potential problem created by such a packaging structure, particularly during high power operations, is apparent.

The encapsulant must also be an electrical insulator to prevent shorting of adjacent conductors since the circuit and terminations are completely surrounded. Because materials which are effective thermal conductors are typically also electrical conductors, it has been difficult to effectively encapsulate microelectronic circuits so that the package is both electrically insulated and thermally conductive. Or, stated more simply, it has been necessary to use separate external heat sinks to conduct built-up heat away from the circuit area to be dissipated into the ambient atmosphere.

A further problem encountered in the prior art solution to this problem has been the necessity for providing a number of glass-to-metal seals to isolate terminals connected to the circuit from the conductive heat sinks. This necessitated the assembly of many piece parts which involved substantial manufacturing labor. Also, the passage of terminals or leads through the base degraded the thermal properties of the base and reduced its effectiveness as a heat sink.

The prior art arrangements also called for connecting the lead frame to the circuit prior to the encapsulation process. Therefore, the temperature permitted during the assembly process and encapsulation was limited to that range which was suitably low to prevent damage to the circuit chip. This greatly reduced the choice of encapsulating material. Further, any damage caused to the circuits during assembly or encapsulation would not be detected until the entire packaging process was completed. Rejected packages, determined at this stage of manufacture, represent an expensive loss of yield.

An example of such previously manufactured microelectronic packages is found in U.S. Pat. No. 3,312,771 issued to P. S. Hessinger et al. This patent discloses a package in which microelectronic circuits are supported on a beryllium oxide base. Since beryllium oxide is not electrically conductive, the necessary electrical isolation between the conductors connecting to the circuit is obtained. Beryllium oxide is also a reasonably good thermal conductor and the exposed lower portion of the base is fairly effective as a heat sink. A plurality of conductor elements extend through the side walls of the beryllia base to a pocket in a second embodiment of the invention. These conductor elements are then brazed to the base to provide mechanical stability.

Even this attempt to solve the problem of electrical isolation and thermal conductivity by using the distinctive properties of beryllia has its limitations. First, the thermal conductivity of beryllium oxide is less than one-half that of copper. Second, beryllium oxide is a sintered material which means it is somewhat difficult to fabricate. Further, since beryllium oxide is such a dangerous and toxic substance, extreme care must be employed in working with the material since even breathing the dust created by machining can cause fatal beryllium poisoning.

It is, therefore, an object of our invention to produce a microelectronic circuit package in which the supporting base is fabricated from a metal sheet which acts as a heat sink to remove built-up heat from the interior of the package.

It is also an object of our invention to fabricate an electrically isolated and thermally conductive unit to which the circuit may then be connected.

SUMMARY OF THE INVENTION

A lead frame for connection to a microelectronic circuit chip is laminated to a supporting metal base between formed layers of insulation prior to assembly of the package. This provides electrical isolation between the individual conductors of the lead frame and the metal base while permitting the chip to be metallurgically bonded to an exposed region of the base after the lamination is completed. Built-up heat is dissipated from the package by conduction through the base.

In a specific embodiment of the invention, glass fiber mat impregnated with a partially cured polyamide is sandwiched on either side of an array of lead frame conductors. The sandwich is then stacked on a metal base. The stacked assembly is subjected to sufficient heat and pressure to substantially transform the impregnate to a polyimide. The resulting fusion effectively bonds the impregnated mats, the lead frame conductors and the metal base into a single unit.

DESCRIPTION OF THE ILLUSTRATED EMBODIMENT

Figure 1:
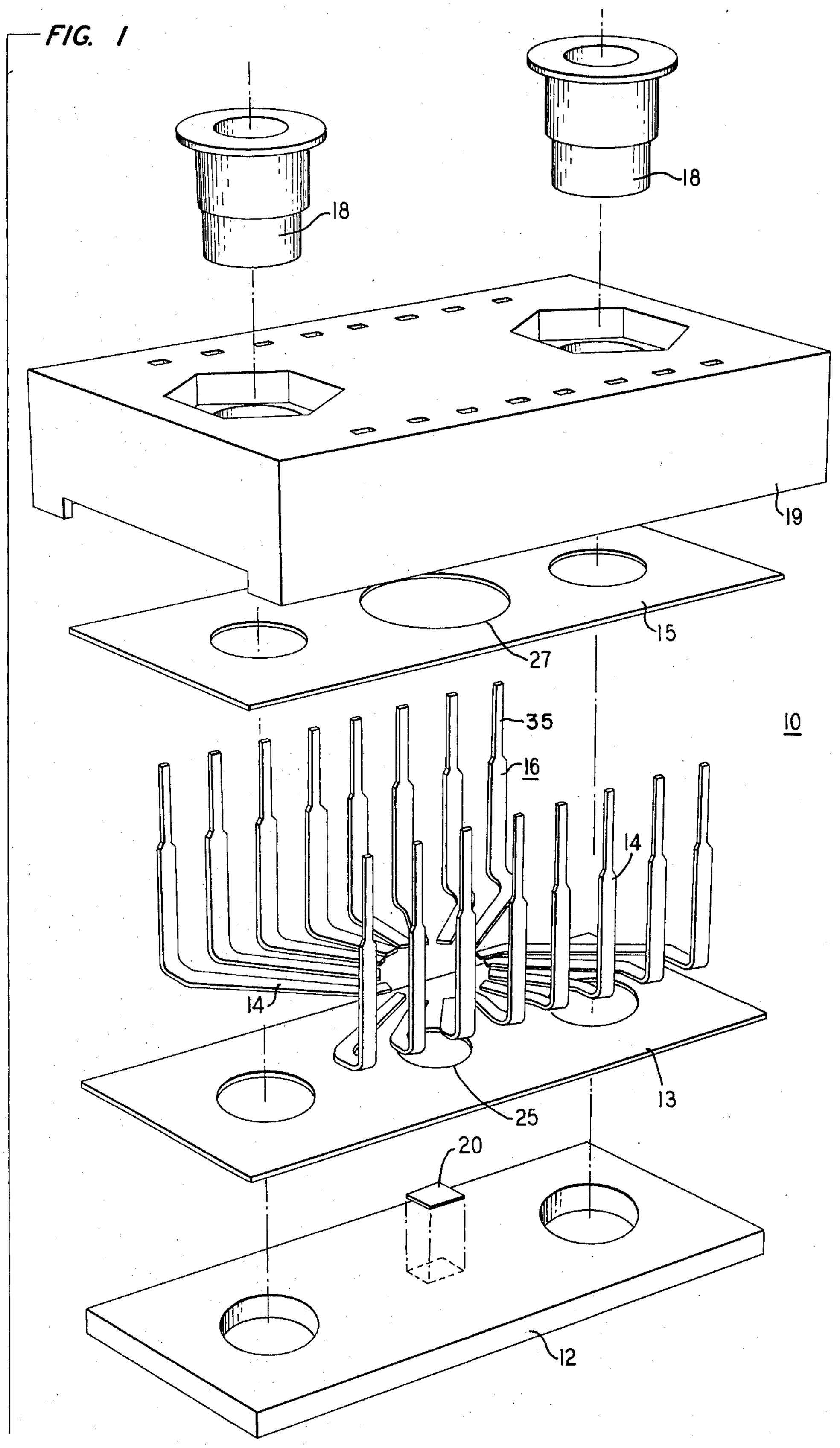
FIG. 1 is an exploded perspective view of a device embodying my invention.

The microelectronic circuit package 10 shown in FIG. 1 provides both thermal and mechanical protection for the microelectronic circuit chip 20. Package 10 comprises a metal base 12 to which chip 20 is bonded, electrical insulation layers 13 and 15 provided on either side of a lead frame 16, and a cover 19.

Base 12 provides a mechanically stable mounting for chip 20 and, since it is metal, also acts as a heat sink. Although many metals would be suitable, the combination of economics, ease of manufacture, thermal conductivity and bonding compatibility make copper the preferred material for base 12. The base can effectively be manufactured many ways, but the simplest and most economical is by stamping base 12 from sheet stock. A thickness of 0.050 inch has been found suitable, but is not critical. The shape of base 12 is relatively unimportant. Although the base is shown with a rectangular outline, a circular, triangular, square or irregular outline could be equally effective. The purpose of assembly holes 24 will be discussed below.

Lead frame 16 consists of a plurality of individual and electrically isolated conductors 14, each having a first end 34 for connection to chip 20 and a second end 35 for connection outside the package to the circuit or system (not shown) in which the circuitry of the chip is utilized. The first ends 34 may be advantageously formed to provide a circular opening although the shape is not critical and could be square, triangular, rectangular, etc. The shape of the second ends 35 could be adopted for wire-wrapped connections, printed wiring board insertion, etc., depending on how the circuit is utilized. Lead frame 16 is quite effectively manufactured from 10 mil copper sheet which is punched to form the indicated shape. Although each of the terminals 14 has been shown as unconnected to each other, depending on the manufacture and assembly methods employed, it may be advantageous to leave temporary "bridges" connecting the terminals to facilitate placement and handling of the lead frame. The "bridges" could then be removed in a subsequent operation.

Figure 2:
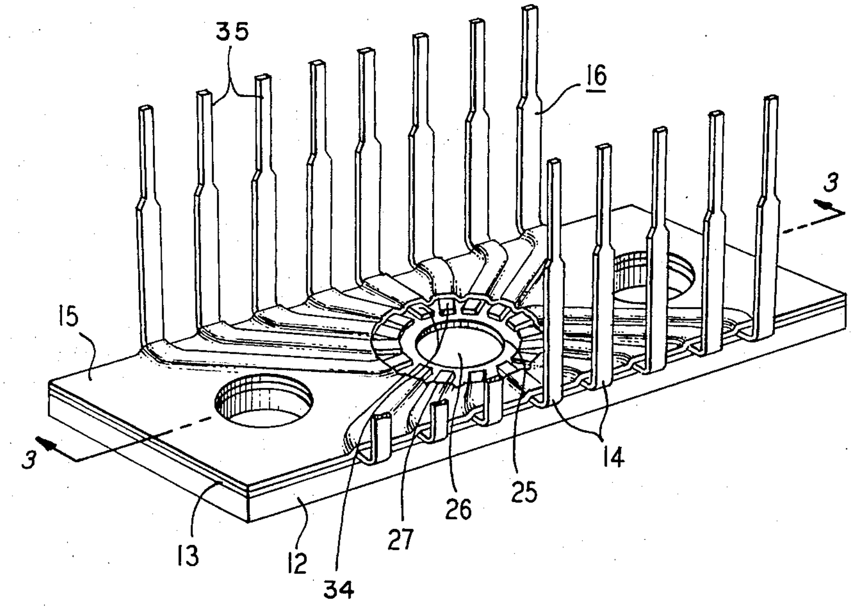
FIG. 2 shows a perspective view of the laminated assembly of the lead frame and base.

Insulation layers 13 and 15 are placed above and below lead frame 16 to electrically isolate the individual terminals from each other and from base 12. As FIG. 2 readily shows, a central hole 25 in the bottom layer 13 has a diameter smaller than, and concentric with, the circle described by first ends 34 but larger than chip 20. Layer 15 also has a central hole 27. Hole 27 is concentric with hole 25 and has a diameter large enough to leave the first ends 34 uncovered. Layers 13 and 15 are effectively fabricated from, for example, 8.5 mil thick, aromatic polyimide-impregnated, woven glass fiber fabric. The impregnate in the fabric advantageously is B stage cured prior to assembly. Suitable impregnate is available from Dupont Chemical Company under the trade name PYRALIN.

Cover 19, as can be seen in FIG. 1, is shaped to enclose chip 20, lead frame 16 with exception of the second ends 35, layers 13 and 15, and the upper surface of base 12. The configuration of cover 19 lends itself readily to fabrication from plastic by injection molding, for example, nylon or polypropylene.

The assembly of package 10 begins with the fabrication of the individual piece parts. The second step is to roughen the upper surface 29 of base 12. This improves the adhesion of surface 29, the importance of which will become apparent in later steps. Although many mechanical and chemical processes could be used to produce the roughness, perhaps the simplest is to merely oxidize surface 29. A suitable oxidizer is produced by Enthone, Inc. of New Haven, Conn., under the trade name EBANOL C.

Figure 3:
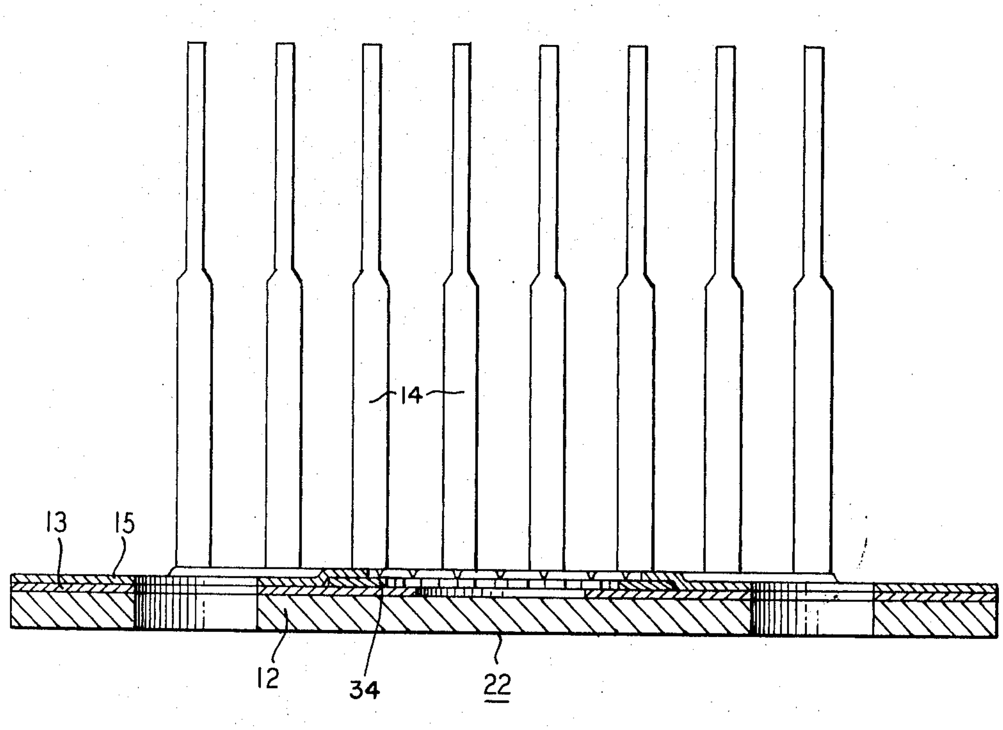
FIG. 3 shows a cross-sectional view of the assembly of FIG. 2 along the path indicated.

The next step of assembly is to stack base 12, layer 13, lead frame 16 and layer 15. It is very desirable at this stage of assembly to join these parts into a single, rigid, mechanically stable unit. To form such a laminated unit 22, shown in FIGS. 2 and 3, the partially, i.e., B stage, cured layers 13 and 15 must be fully cured. Curing is effected by applying heat and pressure according to the following:

1. Subject the stacked pieces to a pressure of 500 psi and a temperature of 380° C for 3 minutes.
2. Maintain temperature while raising the pressure to 1,700 psi where it is held for 3 additional minutes.
3. Maintain the pressure while allowing the temperature to cool to 100° C.
4. When 100° C is reached, release the pressure to atmospheric and allow the stack to cool to room temperature.

Once the polyimide is cured, it becomes "thermoset" and thereby capable of sustaining a moderate temperature rise without decomposition or loss of rigidity. The lamination process not only produces cross-linking between layers 13 and 15 to surround a substantial portion of lead frame 16, but also produces enhanced adherence to upper surface 29 of base 12. At this point, laminated unit 22 is a rigid, mechanically stable assembly of base 12, layer 13, lead frame 16 and layer 15.

Next, the portion of surface 29 which was not covered by layer 13 must be prepared. This exposed region 26 is effectively prepared by removing the oxidation with a suitable acid bath. The "clean" surface 26 is next plated with 5–10 mg/in$^2$ of nickel followed by 8–15 mg/in$^2$ of gold. Such processes are well-known and need not be described in detail. Once the exposed region 26 is prepared, chip 20 is positioned on the region and metallurgically bonded to base 12. It is significant to note here that chip 20 is assembled *after* the heat and pressure were applied to laminate the stacked pieces. This insures that chip 20 is not damaged by being subjected to the high temperatures or pressures necessary for that operation.

Figure 4:
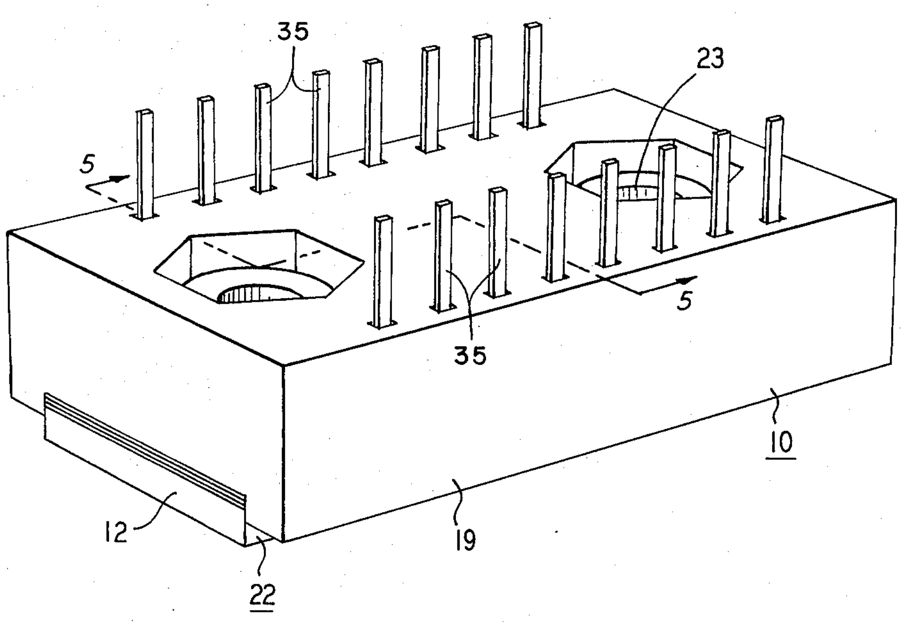
FIG. 4 shows a perspective view of the device of FIG. 1 completely assembled.
Figure 5:
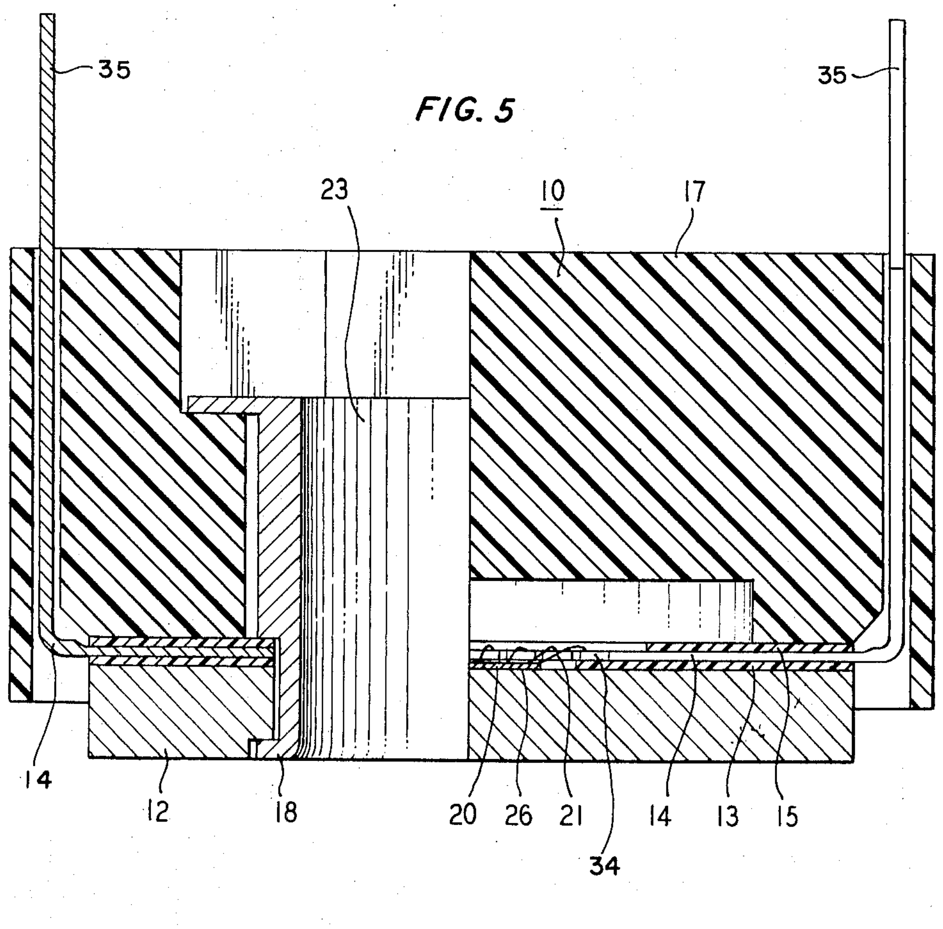
FIG. 5 shows a cross-sectional view of the device of FIG. 4 along the path indicated.

With chip 20 bonded in place, the next step of assembly is to connect the first ends 34 to the chip via interconnecting wires 21 (this can be seen in FIG. 5). The final step of assembly of unit 10 is to place cover 19 in position with terminals 14 through feed-through holes 28 and to secure it to base 12 with units 18. As FIGS. 4 and 5 show, chip 20 is then completely surrounded and well protected both mechanically and thermally. The thermal protection arises from the heat sink capabilities of base 12. The base has a relatively large area and, since the bottom surface and part of the sides are exposed, is capable of transmitting substantial heat away from chip 20 to be dissipated into the atmosphere Because there may be applications in which it is desired to dissipate extremely large quantities of heat, or where other considerations require that base 12 be substantially smaller in size relative to chip 20, a separate heat sink may be used in conjunction with package 10. The separate heat sink (not shown) could be very conveniently connected to base 12 by inserting fasteners (not shown) through the holes 23 of rivets 18. This would position the exposed bottom of base 12 against the separate heat sink, thereby increasing the effective area for heat dissipation.

Although layers 13 and 15 have been described as polyimide impregnated, woven glass fiber, it should of course be apparent that other materials would in some instance be suitable as well. The material of layers 13 and 15 should be initially partially cured to permit forming and shaping of the layers to terminals 14. Once shaped, the layers must be fully cured to "bond" the lead frame 16, base 12 and layers 13 and 15 into a single rigid, and mechanically stable unit. Once cured, the material of layers 13 and 15 must react like a thermoset plastic and not become tractable with increased temperatures. Such a material need not be cured by the combination of heat and pressure, but may be cured by conventional methods which are determined by the characteristics of the materials.

More generally, the impregnate material most suitable for practice of the present invention is a polyimide, or a polyimide-polyamide mixture, which has undergone partial curing after having been initially applied to the glass fiber fabric. The impregnate conventionally originates with reacting an aromatic dianhydride and an aromatic amine.

Thus, pyromellitic dianhydride and 4,4′ diamino, diphenyl ether in suitable proportions are heated to a temperature of about 100° C to form the polyamic acid. The latter is at this point a slurry and not a true thermoset resin. Then, the slurry is applied to a glass fiber mat and heated or reheated to a temperature sufficiently high to expel water. Upon cool-down, the cloth and impregnated polyamic acid is typically dry to the touch, but not cured at all. It is at this stage colloquially termed a "pre-preg" cloth. Conveniently, at this point, although not necessarily, the pre-preg product is subjected to a B-stage heat cure, as a result of which the polyamic acid becomes essentially a polyamide. The impregnated cloth is now partially cured, and as such is less tacky and easier to handle.

Importantly, and pursuant to the invention, the last stage of the chemical change occurring to the impregnate is brought about during the aforementioned laminating operation, with the application of heat and pressure.

It is to be understood that the embodiments described herein are merely illustrative of the principles of my invention. Various modifications may be made thereto by persons skilled in the art without departing from the spirit and scope of my invention.

What is claimed is:

1. A heat dissipating package assembly for a microelectronic circuit chip wherein no thermal treatment or contact of the chip with encapsulating media is required after the chip is mounted and connected within the assembly, said package assembly comprising:

a thermally conductive plate of metal serving as a base for mounting of the chip thereon;

a lead frame assembly comprising a first insulating sheet and a second insulating sheet in face to face relationship, each such sheet being made up or a mass of glass fibers impregnated with a thermoset resin and a plurality of electrically conductive leads each having a flat portion disposed between and bonded to said insulating sheets by said resin, said first insulating sheet having bonded to said base that face opposite the one facing said second insulating sheet and having an opening therein leaving exposed an area of said base sufficient to receive the chip when it is mounted on the base, said leads being so arranged as to present first ends disposed adjacent said opening for bonding thereto of connections from the chip, said leads each having an opposite end located outside the package and serving as an external terminal, said second insulating sheet having an opening therein larger than and encompassing the opening in the first sheet so as to leave exposed said first ends of said leads to permit establishing connections to said chip; and mechanical means for enclosing the chip, the face of the base on which the chip is mounted, and the leads except for said external terminals while leaving exposed the opposite face of the base to permit heat to be dissipated therefrom.

2. A package assembly as in claim 1 wherein the leads are angled away from the base at the outer edge of the second insulating sheet, wherein the means for enclosing is a cap of insulating material which fits over the chip carrying side of the base, which is recessed in the area of the chip and the first ends of the leads, and which has a plurality of openings through which the leads pass and from which the external terminals of the leads project.

3. A package assembly as in claim 1 wherein said first ends of the leads are arranged in an essentially circular array around the opening in said first insulating sheet and wherein said terminal ends of the leads are arranged in a dual in line array.

4. A package assembly as in claim 1 wherein the thermoset resin is an aromatic polyimide.

* * * * *